(12) United States Patent
Kim et al.

(10) Patent No.: US 6,624,442 B1
(45) Date of Patent: Sep. 23, 2003

(54) METHOD OF FORMING P-N JUNCTION ON ZNO THIN FILM AND P-N JUNCTION THIN FILM

(76) Inventors: Young-Chang Kim, 1629-40 Seocho-1-dong, Seocho-gu (KR); Sang-Yeol Lee, #10-1002 Misung Apt., Bulkwang-dong, Eunpyung-gu (KR)

( * ) Notice: Subject to any disclaimer, the term of this patent is extended or adjusted under 35 U.S.C. 154(b) by 0 days.

(21) Appl. No.: 10/161,951

(22) Filed: Jun. 4, 2002

(30) Foreign Application Priority Data

Mar. 27, 2002 (KR) .................................. 2002-0016766

(51) Int. Cl.$^7$ ............................................. H01L 29/40
(52) U.S. Cl. ........................... 257/43; 438/45; 438/535
(58) Field of Search ............................. 257/43; 438/45, 438/535

(56) References Cited

U.S. PATENT DOCUMENTS

| | | | | |
|---|---|---|---|---|
| 3,664,867 A | * | 5/1972 | Galli et al. ................. | 428/336 |
| 4,342,879 A | * | 8/1982 | Catalano et al. ............ | 136/265 |
| 4,477,688 A | * | 10/1984 | Barnett et al. .............. | 136/258 |
| 5,786,233 A | * | 7/1998 | Taskar et al. ................ | 438/46 |
| 6,057,561 A | * | 5/2000 | Kawasaki et al. ............ | 257/94 |
| 6,180,960 B1 | * | 1/2001 | Kusuda et al. ............... | 257/91 |

* cited by examiner

Primary Examiner—Jerome Jackson
(74) Attorney, Agent, or Firm—Lee & Hong

(57) ABSTRACT

The present invention discloses a method of forming a p-n junction on a ZnO thin film and a p-n junction thin film. The object of the present invention is to provide a method of forming a p-n junction on a ZnO thin film and a p-n junction thin film which deposits $Zn_3P_2$ on a ZnO thin film and forms a p-type material constituting a device by using thermal diffusion for the $Zn_3P_2$ in order to fabricate an effective p-type material. The method of forming a p-n junction on a ZnO thin film, in a light emitting device having a sapphire substrate as a base substrate, comprises the steps of: cladding the sapphire substrate with a n-type ZnO thin film; depositing a $Zn_3P_2$ thin film on the n-type ZnO thin film; forming a p-type ZnO thin film by irradiating a laser on the upper surface of the $Zn_3P_2$ thin film, decomposing the $Zn_3P_2$ thin film and diffusing the same on the n-type ZnO thin film; and forming an electrode on the n-type ZnO thin film and the p-type ZnO thin film respectively. According to the present invention, an effective light emitting device can be fabricated by depositing $Zn_3P_2$ on the upper surface of a ZnO thin film, irradiating the laser on the $Zn_3P_2$ film and thereby substituting the $Zn_3P_2$ film for a p-type material. Moreover, by a multi-layer junction of the p-type material, a light emitting device of an extended concept such as npn-type and pnpn-type can be fabricated.

3 Claims, 5 Drawing Sheets

METHOD OF FORMING P-N JUNCTION ON ZNO THIN FILM AND P-N JUNCTION THIN FILM

BACKGROUND OF THE INVENTION

1. Field of the Invention

The present invention relates to a method of forming a p-n junction on a ZnO thin film and a p-n junction thin film, and more particularly, to a method of forming a p-n junction on a ZnO thin film and a p-n junction thin film which can fabricate a LED device by depositing $Zn_3P_2$ on the ZnO thin film and forming it into an effective p-type material.

2. Description of the Related Art

In our technical world displays have an important function as human interfaces for making abstract information available through visualization. In the past, many applications for displays were identified and realized, each with its own specific requirements. Therefore, different display technologies have been developed, each having their own strengths and weaknesses with respect to the requirements of particular display applications, thus making a particular display technology best suited for a particular class of applications.

Light emitting diodes (LED) which emit light spontaneously under forward bias conditions have various fields of application such as indicator lamps, devices of visual displays, light sources for an optical data link, optical fiber communication, etc.

In the majority of applications, either direct electronic band-to-band transitions or impurity-induced indirect band-to-band transitions in the material forming the active region of the LED are used for light generation. In these cases, the energy gap of the material chosen for the active region of the LED, i.e. the zone where the electronic transitions responsible for the generation of light within the LED take place, determines the color of a particular LED.

A further known concept for tailoring the energy of the dominant optical transition of a particular material and thus the wavelength of the generated light is the incorporation of impurities leading to the introduction of deep traps within the energy gap. In this case, the dominant optical transition may take place between a band-state of the host material and the energy level of the deep trap. Therefore, the proper choice of an impurity may lead to optical radiation with photon energies below the energy gap of the host semiconductor.

Today, exploiting these two concepts for tailoring the emission wavelength of an LED and using III–V or II–VI compound semiconductors or their alloys for the active region of the LED, it is possible to cover the optical spectrum between near infrared and blue with discrete emission lines.

Blue light emitting MIS diodes have been realized in the GaN system. Examples of these have been published in:

"Violet luminescence of Mg-doped GaN" by H. P. Maruska et al., Applied Physics Letters, Vol. 22, No. 6, pp. 303–305, 1973, "Blue-Green Numeric Display Using Electroluminescent GaN" by J. I. Pankove, RCA Review, Vol. 34, pp. 336–343, 1973, "Electric characteristics of GaN: Zn MIS-type light emitting diode" by M. R. H. Khan et al., Physica B 185, pp. 480–484, 1993, "GaN electroluminescent devices: preparation and studies" by G. Jacob et al., Journal of Luminescence, Vol. 17, pp. 263–282, 1978, EP-0-579 897 A1: "Light-emitting device of gallium nitride compound semiconductor".

Unfortunately, the present-day LEDs suffer from numerous deficiencies. Light emission in the LED is spontaneous, and, thus, is limited in time on the order of 1 to 10 nanoseconds. Therefore, the modulation speed of the LED is also limited by the spontaneous lifetime of the LED.

Attempts were made to improve the performance of the LEDs. For example, a short wavelength blue semiconductor light emitting device has been developed. The compound semiconductor device of gallium nitrite series such as GaN, InGaN, GaAlN, InGaAlN has been recently considered as a material of the short wavelength semiconductor light emitting device.

For example, in the semiconductor light emitting device using GaN series material, a room temperature pulse oscillation having wavelength of 380 to 417 nm is confirmed.

However, in the semiconductor laser using GaN series material, a satisfying characteristic cannot be obtained, a threshold voltage for a room temperature pulse oscillation ranges from 10 to 40V, and the variation of the value is large.

This variation is caused by difficulty in a crystal growth of the compound semiconductor layer of gallium nitride series, and large device resistance. More specifically, there cannot be formed the compound semiconductor layer of p-type gallium nitride series having a smooth surface and high carrier concentration. Moreover, since contact resistance of a p-side electrode is high, a large voltage drop is generated, so that the semiconductor layer is deteriorated by a heat generation and a metal reaction even when the pulse oscillation is operated. In consideration of a cheating value, the room temperature continuous oscillation cannot be achieved unless the threshold voltage is reduced to less than 10V.

Moreover, when a current necessary to the laser generation is implanted, the high current flows locally and a carrier cannot be uniformly implanted to an active layer, and an instantaneous breakage of the device occurs. As a result, the continuous generation of the laser cannot be achieved.

In the light-emitting device of GaN series, since the p-side electrode contract resistance was high, the operating voltage was increased. Moreover, nickel, serving as a p-side electrode metal, and gallium forming the p-type semiconductor layer, were reacted with each other, melted, and deteriorated at an electrical conduction. As a result, it was difficult to continuously generate the laser.

Besides, SiC and ZnO are known as short wavelength light emitting materials.

However, SiC and ZnO are disadvantageous in that the chemical crystalline thereof is very unstable or a crystal growth itself is difficult for SiC and ZnO to be used as compounds semiconductors required for blue light emission. In case of SiC, it is chemically stable, but the lifetime and brightness thereof are low for SiC to be put into practical use.

Meanwhile, in case of ZnO, it is proper material for blue light emission and shorter wavelength light emission since it has a characteristic similar to GaN. Moreover, ZnO has an excitation binding energy (e.g., 60 meV) about three times larger than that of GaN, it is judged to be a very proper material for short wavelength light element of the next generation.

Nevertheless, even though there was a case where ZnO was fabricated as a p-n junction, the light emission efficiency thereof was very low and thus the availability thereof as an actual device is very low, and it is difficult for ZnO to form a p-type material.

SUMMARY OF THE INVENTION

It is, therefore, an object of the present invention to provide a method of forming a p-n junction on a ZnO thin film and a p-n junction thin film which deposits $Zn_3P_2$ on a ZnO thin film and forms a p-type material constituting a device by using thermal diffusion for the $Zn_3P_2$ in order to fabricate an effective p-type material.

To achieve the above object, there is provided a method of forming a p-n junction on a ZnO thin film on a sapphire base substrate for use in a light emitting device in accordance with a preferred embodiment of the present invention, comprising the steps of: cladding the sapphire substrate with a n-type ZnO thin film; depositing a $Zn_3P_2$ thin film on the n-type ZnO thin film; forming a p-type ZnO thin film by irradiating a laser on the upper surface of the $Zn_3P_2$ thin film, decomposing the $Zn_3P_2$ thin film and diffusing the same on the n-type ZnO thin film; and forming an electrode on the n-type ZnO thin film and the p-type ZnO thin film respectively.

Preferably, there is provided a method of forming a p-n junction on a ZnO thin film which fabricates a multi-layer light emitting device of npn-type or pnpn-type by repeatedly forming a n-type ZnO thin film and a p-type ZnO thin film on the sapphire substrate.

Meanwhile, there is provided a p-n junction thin film on a sapphire base substrate for use in a light emitting device in accordance with the present invention, comprising: a n-type ZnO thin film on the sapphire substrate formed by a cladding; a $Zn_3P_2$ thin film deposited on the n-type ZnO thin film; a p-type ZnO thin film by irradiating a laser on the upper surface of the $Zn_3P_2$ thin film and decomposing the $Zn_3P_2$ thin film and diffusing the same on the n-type ZnO thin film; and an electrode on the n-type ZnO thin film and the p-type ZnO thin film respectively.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

FIG. 1 is a view illustrating a sapphire substrate which is a typical base substrate; FIG. 1b is a view illustrating an example of depositing a n-type ZnO thin film by a PLD in accordance with a first embodiment of the present invention; FIG. 1c is a view illustrating an example of depositing a $Zn_3P_2$ thin film on the n-type thin film of FIG. 1b; and FIG. 1d is a view illustrating the step of performing laser annealing on the $Zn_3P_2$ thin film of FIG. 1c.

Referring to this, the present invention relates to a method of forming a single, complete p-n junction device by applying a $Zn_3P_2$ material on a ZnO thin film for depositing a p-type dopant material and fabricating an effective p-type material through decomposition and diffusion of the $Zn_3P_2$ material using a laser.

Therefore, the $Zn_3P_2$ material employed in the present invention acts as a source for diffusion of p on the ZnO thin film. That is, a n-type ZnO thin film 20 is adhered on a sapphire substrate 10 which is a base substrate, and a $Zn_3P_2$ film 30 is deposited on this ZnO thin film 20.

After the completion of the deposition of the $Zn_3P_2$ film 30, if the laser is irradiated on the upper surface of the thin film, the energy of the laser is penetrated into the $Zn_3P_2$ film 30. This penetrated energy thermal-decomposes component molecules constituting the $Zn_3P_2$ film 30 into Zn and P respectively. That is, the laser energy activates the molecular motion for Zn and P and weakens their respective binding force, for thereby achieving thermal decomposition.

At this time, the P is used as a p-type dopant, i.e., an acceptor material which penetrates into the ZnO thin film 20 upon receipt of the laser energy and forms the $Zn_3P_2$ film 30 as p-type by serving as a substituent for 0.

Figure 1A:
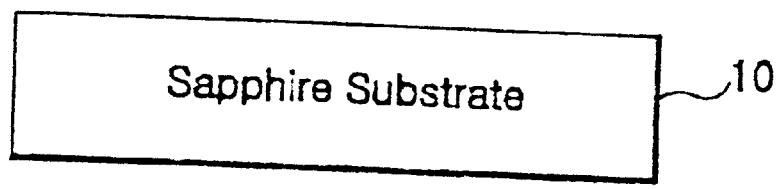
FIG. 1 is a view illustrating a sapphire substrate which is a typical base substrate.
FIG. 1b is a view illustrating an example of depositing a n-type ZnO thin film by a PLD in accordance with a first embodiment of the present invention.
FIG. 1c is a view illustrating an example of depositing a $Zn_3P_2$ thin film on the n-type thin film of FIG. 1.
FIG. 1d is a view illustrating the step of performing laser annealing on the $Zn_3P_2$ thin film of FIG. 1c.
Figure 1B:
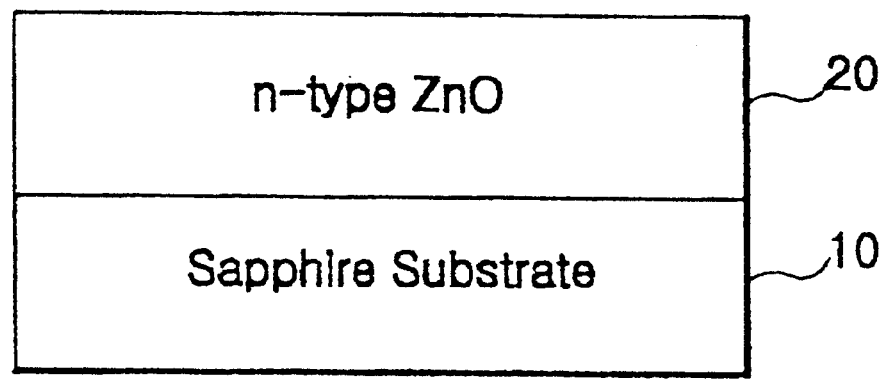
Figure 1C:
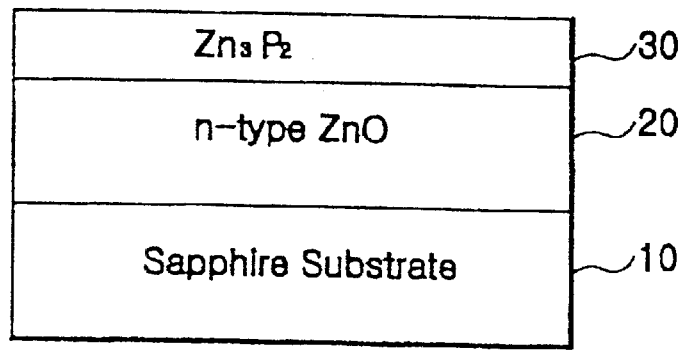
Figure 1D:
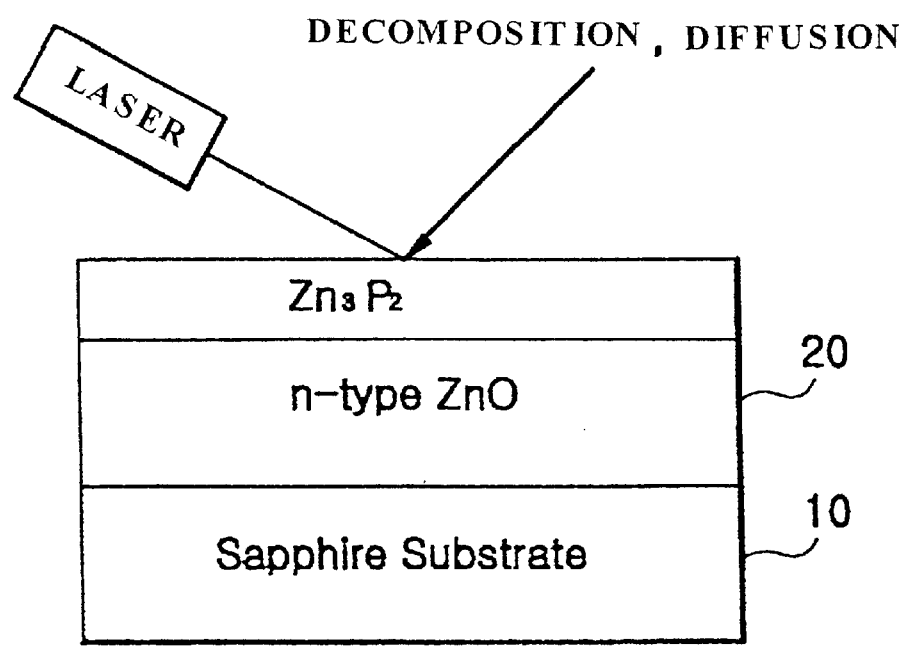
Figure 2A:
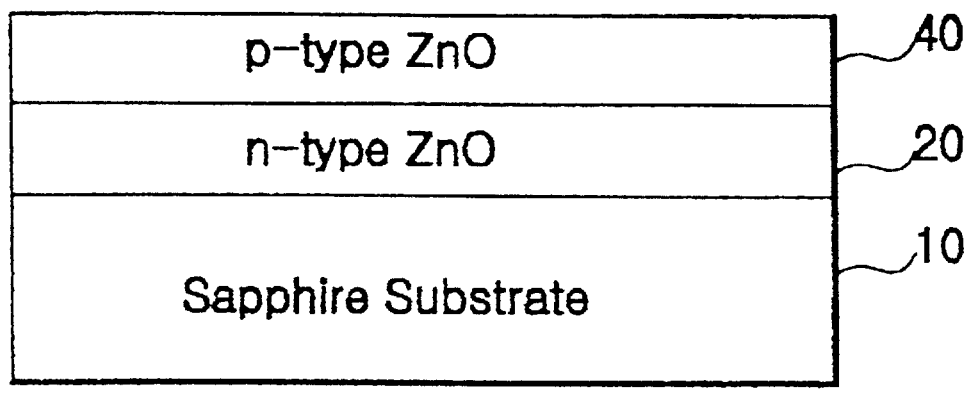
FIG. 2a is a view illustrating the state of a p-n homojunction which is formed by the step of FIG. 1d.
Figure 2B:
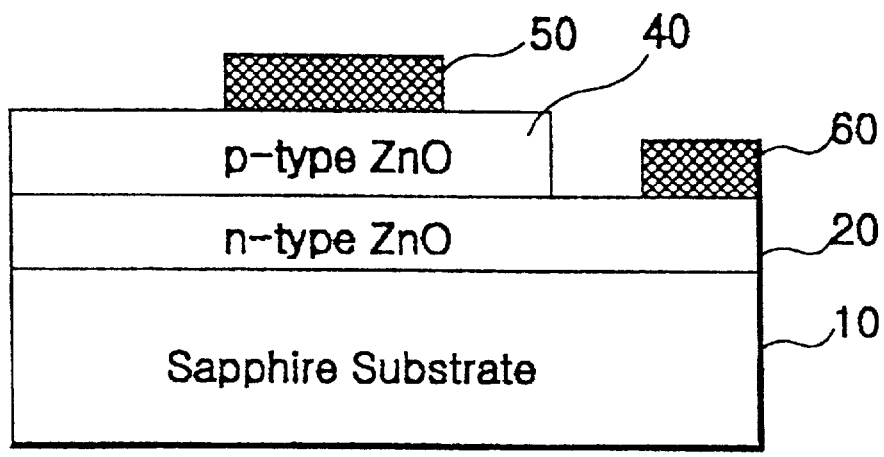
FIG. 2b is a view illustrating a p-n junction device which forms an electrode on p- and n-type materials.

FIG. 2a is a view illustrating the state of a p-n homojunction which is formed by the step of FIG. 1d; FIG. 2b is a view illustrating a p-n junction device which forms an electrode on p- and n-type materials; and FIG. 2c is a view illustrating the state in which a forward voltage is applied to the p-n junction device formed as shown in FIG. 2b.

Figure 2C:
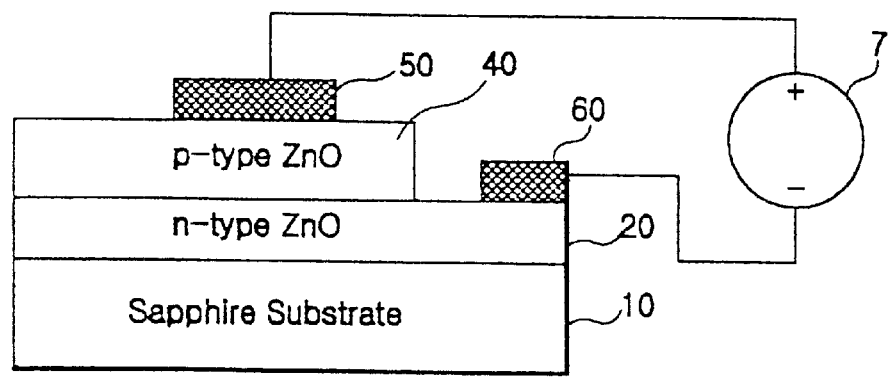
FIG. 2c is a view illustrating the state in which a forward voltage is applied to the p-n junction device formed as shown in FIG. 2b.

Referring to this, according to the principles of FIGS. 1a, 1b and 1c, if the laser is irradiated on the upper surface of the $Zn_3P_2$ film 30 deposited on the ZnO thin film, the $Zn_3P_2$ film 30 is transformed into a ZnO thin film 40 of p-type, as illustrated in FIGS. 2a through 2c, through substitution.

When electrodes 50 and 60 are formed on the p-type ZnO thin film 20 and the n-type ZnO thin film 40, and a forward voltage 70 is applied thereon as illustrated in FIG. 2c, EL(Electroluminescence) is generated at the interface between the p-type ZnO thin film 20 and the n-type ZnO thin film 40.

Figure 3:
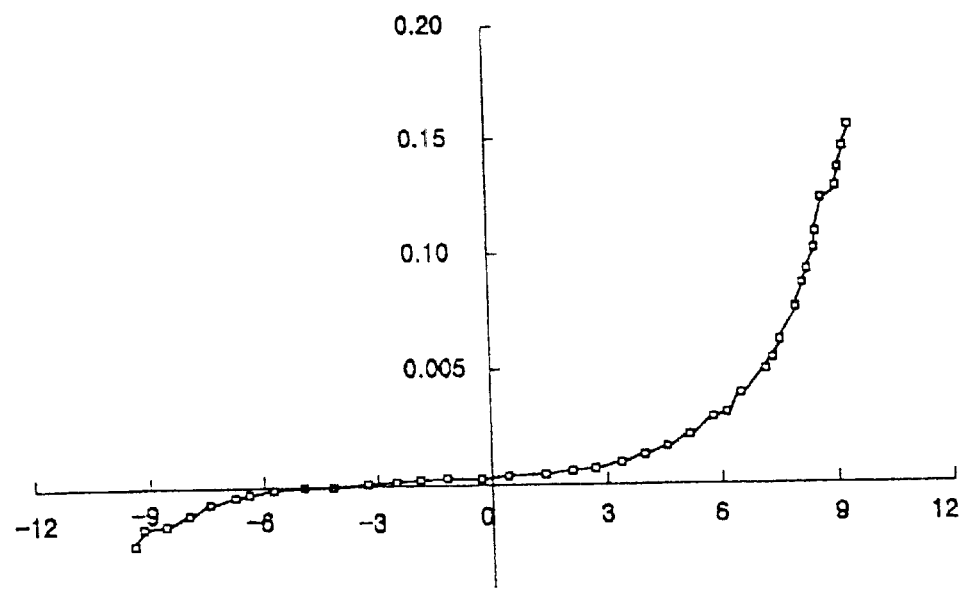
FIG. 3 is a graph illustrating the result of measuring the current and voltage of the p-n junction device which is formed by the method of forming a p-n junction on the ZnO thin film in accordance with the first embodiment of the present invention.

FIG. 3 is a graph illustrating the result of measuring the current and voltage of the p-n junction device which is formed by the method of forming a p-n junction on the ZnO thin film in accordance with the first embodiment of the present invention.

Referring to this, in FIG. 3 which is a graph for identifying current-voltage (I-V) characteristics for the p-n junction device which is formed by the above method, it is checked whether the p-n junction device, which is fabricated by the above method, has semiconductor characteristics through an experiment for measuring a current value corresponding to a predetermined voltage value.

As the result of the checking, it is found that the p-n junction device of the present invention is related with electric conductivity characteristics, for example, hysteresis, which are generated by lattice bonding of a semiconductor. That is, it is found that the p-n junction device has semiconductor device characteristics.

Figure 4A:
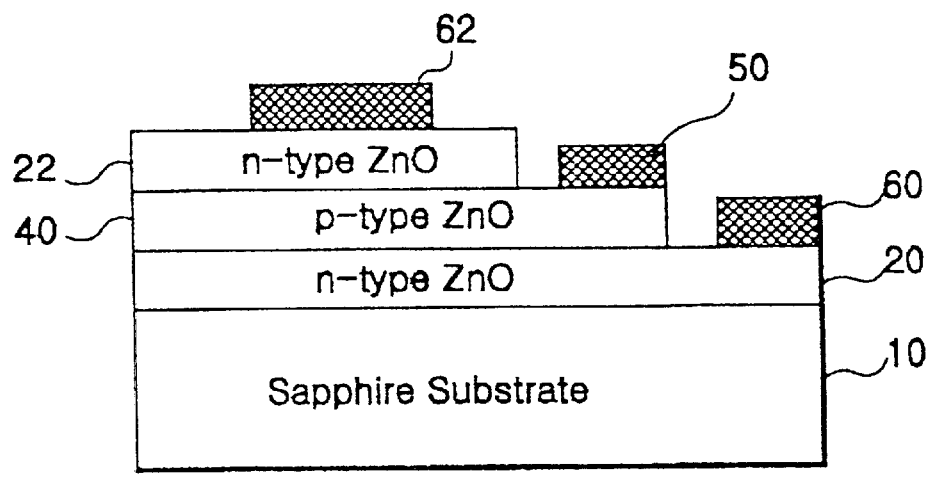
FIGS. 4a and 4b are views illustrating a p-n junction device of a multi-layer structure which is formed by repeatedly carrying out the method of forming a p-n junction on a ZnO thin film in accordance with the first embodiment of the present invention.
Figure 4B:
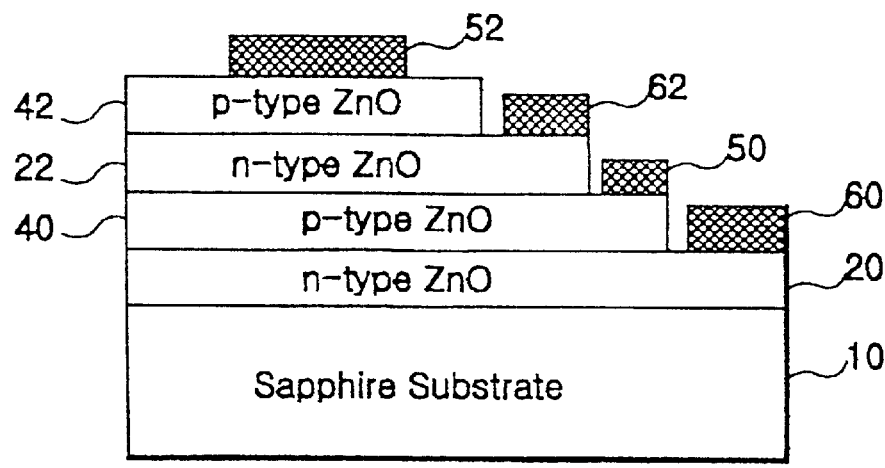

FIGS. 4a and 4b are views illustrating a p-n junction device of a multi-layer structure which is formed by repeatedly carrying out the method of forming a p-n junction on a ZnO thin film in accordance with the first embodiment of the present invention.

Referring to this, not only the p-n junction device is fabricated by carrying out the above method, but also a multi-layer p-n junction device can be fabricated by repeatedly carrying out annealing using a p-n junction and a laser. At this time, the multi-layer p-n junction device is divided into npn-type, pnp-type or the like according to the properties of the deposited thin film thereof.

That is, as illustrated in FIG. 4a, a $Zn_3P_2$ film 30 is deposited on a n-type ZnO thin film 20 and the laser is irradiated on the upper surface of the $Zn_3P_2$ film 30, to thus form a-type ZnO thin film 40. Then, when a n-type ZnO thin film 22 is deposited on the p-type ZnO thin film 40 and an electrode is formed on the upper surface of the n-type, p-type and n-type ZnO thin films 20, 40 and 22 respectively, a npn-type device is fabricated. If another p-type ZnO thin film 42 is formed, a pnpn-type device as shown in FIG. 4b is fabricated.

While the invention has been shown and described with reference to certain preferred embodiments thereof, it will be understood by those skilled in the art that various changes in form and details may be made therein without departing from the spirit and scope of the invention as defined by the appended claims.

As described above, the method of forming a p-n junction on a ZnO thin film and the p-n junction thin film according to the present invention can fabricate an effective light emitting device by depositing $Zn_3P_2$ on the upper surface of a ZnO thin film, irradiating the laser on the $Zn_3P_2$ film and thereby substituting the $Zn_3P_2$ film for a p-type material. Moreover, by a multi-layer junction of the p-type material, a light emitting device of an extended concept such as npn-type and pnpn-type can be fabricated.

What is claimed is:

1. A method of forming a p-n junction on a ZnO thin film on a sapphire base substrate for use in a light emitting device, comprising the steps of:

cladding the sapphire substrate with a n-type ZnO thin film;

depositing a $Zn_3P_2$ thin film on the n-type ZnO thin film;

forming a p-type ZnO thin film by irradiating a laser on the upper surface of the $Zn_3P_2$ thin film, decomposing the $Zn_3P_2$ thin film and diffusing the same on the n-type ZnO thin film; and forming an electrode on the n-type ZnO thin film and the p-type ZnO thin film, respectively.

2. The method of claim 1, wherein a multi-layer light emitting device of npn-type or pnpn-type is fabricated by repeatedly forming a n-type ZnO thin film and a p-type ZnO thin film on the sapphire substrate.

3. A p-n junction thin film on a sapphire base substrate for use in a light emitting device, comprising:

a n-type ZnO thin film on the sapphire substrate formed by a cladding;

a $Zn_3P_2$ thin film deposited on the n-type thin film;

a p-type ZnO thin film by irradiating a laser on the upper surface of the $Zn_3P_2$ thin film and decomposing the $Zn_3P_2$ thin film and diffusing the same on the n-type ZnO thin film; and an electrode on the n-type ZnO thin film and the p-type ZnO thin film, respectively.

* * * * *

UNITED STATES PATENT AND TRADEMARK OFFICE
CERTIFICATE OF CORRECTION

PATENT NO.     : 6,624,442 B2
DATED          : September 23, 2003
INVENTOR(S)    : Williams et al.

It is certified that error appears in the above-identified patent and that said Letters Patent is hereby corrected as shown below:

<u>Column 11,</u>
Line 60, "of photon" should be -- of a photon --.
Line 62, "lock" should be -- block --.

Signed and Sealed this

Thirteenth Day of January, 2004

JON W. DUDAS
*Acting Director of the United States Patent and Trademark Office*